US012751025B2

(12) United States Patent
Hebert et al.

(10) Patent No.: US 12,751,025 B2
(45) Date of Patent: Sep. 29, 2026

(54) INSULATING-GATE BIPOLAR TRANSISTORS INCLUDING A REVERSE CONDUCTING DIODE

(71) Applicant: GlobalFoundries U.S. Inc., Malta, NY (US)

(72) Inventors: Francois Hebert, San Mateo, CA (US); James A. Cooper, Santa Fe, NM (US)

(73) Assignee: GlobalFoundries U.S. Inc., Malta, NY (US)

( * ) Notice: Subject to any disclaimer, the term of this patent is extended or adjusted under 35 U.S.C. 154(b) by 406 days.

(21) Appl. No.: 18/235,161

(22) Filed: Aug. 17, 2023

(65) Prior Publication Data

US 2025/0063748 A1 Feb. 20, 2025

(51) Int. Cl.

*H10D 12/00* (2025.01)
*H10D 8/00* (2025.01)
*H10D 12/01* (2025.01)
*H10D 62/832* (2025.01)

(52) U.S. Cl.

CPC ............. *H10D 12/441* (2025.01); *H10D 8/00* (2025.01); *H10D 12/021* (2025.01); *H10D 12/032* (2025.01); *H10D 12/416* (2025.01); *H10D 12/461* (2025.01); *H10D 12/481* (2025.01); *H10D 62/8325* (2025.01)

(58) Field of Classification Search

CPC ...... H10D 8/00; H10D 12/021; H10D 12/031; H10D 12/032; H10D 12/411; H10D 12/416; H10D 12/441; H10D 12/461; H10D 12/481; H10D 62/8325

See application file for complete search history.

(56) References Cited

U.S. PATENT DOCUMENTS 8,343,841 B2 1/2013 Cooper et al.
9,780,206 B2 * 10/2017 Cooper, Jr. ............ H10D 30/65
2007/0158680 A1 * 7/2007 Ozeki .................. H10D 12/032 257/163

(Continued)

FOREIGN PATENT DOCUMENTS

CN 107464842 A * 12/2017 ........... H10D 62/111
CN 111048585 A * 4/2020 ............. H10D 12/01

(Continued)

OTHER PUBLICATIONS

K. Koseki et al., "Dynamic behavior of a medium-voltage N-channel SiC-IGBT with ultra-fast switching performance of 300 kV/as," 2016 19th International Conference on Electrical Machines and Systems (ICEMS), 2016, pp. 1-6.

(Continued)

*Primary Examiner* — Matthew E Warren

(74) *Attorney, Agent, or Firm* — Thompson Hine LLP; Francois Pagette

(57) ABSTRACT

Structures for an insulated-gate bipolar transistor and methods of forming a structure for an insulated-gate bipolar transistor. The structure comprises a semiconductor substrate having a front surface and a back surface opposite from the front surface. The semiconductor substrate comprises a wide bandgap semiconductor material. The structure further comprises a gate electrode at the front surface of the semiconductor substrate, and a diode at the back surface of the semiconductor substrate.

18 Claims, 7 Drawing Sheets

(56) References Cited

U.S. PATENT DOCUMENTS

| | | | | |
|---|---|---|---|---|
| 2009/0283776 | A1* | 11/2009 | Iwamuro | H10D 30/665 438/584 |
| 2015/0132895 | A1* | 5/2015 | Kamijo | H10D 12/032 438/138 |
| 2015/0270356 | A1* | 9/2015 | Palacios | H10D 62/8503 438/478 |
| 2019/0245070 | A1* | 8/2019 | Yilmaz | H10D 64/23 |

FOREIGN PATENT DOCUMENTS

| | | | | | |
|---|---|---|---|---|---|
| CN | 112687743 | A | | 4/2021 | |
| CN | 113745351 | A | * | 12/2021 | H10D 62/8325 |
| JP | WO2004109808 | A1 | * | 7/2006 | H10D 62/142 |
| JP | 6557925 | B2 | | 8/2019 | |
| WO | WO-2013018760 | A1 | * | 2/2013 | H01L 24/05 |

OTHER PUBLICATIONS

J. Zhang, J. Luo, Z. Chen, Z. Li and B. Zhang, "A Novel Snapback-Free Reverse-Conducting IGBT with Si/SiC Heterojunction," 2020 4th IEEE Electron Devices Technology & Manufacturing Conference (EDTM), 2020, pp. 1-4, doi: 10.1109/EDTM47692.2020.9117870.

T. Kimmer, J. Oehmen, P. Tuerkes and S. Voss, "Reverse Conducting IGBT—A new Technology to Increase the Energy Efficiency of Induction Cookers," 2008 IEEE Power Electronics Specialists Conference, 2008, pp. 2284-2287, doi: 10.1109/PESC.2008.4592281.

R. Hermann, E. U. Krafft and A. März, "Reverse-conducting-IGBTs—A new IGBT technology setting new benchmarks in traction converters," 2013 15th European Conference on Power Electronics and Applications (EPE), 2013, pp. 1-8, doi: 10.1109/EPE.2013.6631806.

X. Xu and Z. Chen, "Simulation Study of a Novel Full Turn-On RC-IGBT With Ultralow Energy Loss," in IEEE Electron Device Letters, vol. 40, No. 5, pp. 757-760, May 2019, doi: 10.1109/LED.2019.2905145.

M. Rahimo et al., "A High Current 3300V Module Employing Reverse Conducting IGBTs Setting a New Benchmark in Output Power Capability," 2008 20th International Symposium on Power Semiconductor Devices and IC's, Orlando, FL, USA, 2008, pp. 68-71, doi: 10.1109/ISPSD.2008.4538899.

J. Wei, M. Zhang, H. Jiang, B. Li and K. J. Chen, "Gate Structure Design of SiC Trench IGBTs for Injection-Enhancement Effect," in IEEE Transactions on Electron Devices, vol. 66, No. 7, pp. 3034-3039, Jul. 2019, doi: 10.1109/TED.2019.2914298.

S. Chowdhury et al., "4H—SiC n-Channel Insulated Gate Bipolar Transistors on (0001) and (000-1) Oriented Free-Standing n-Substrates," in IEEE Electron Device Letters, vol. 37, No. 3, pp. 317-320, Mar. 2016, doi: 10.1109/LED.2016.2521164.

E. M. Findlay and F. Udrea, "Reverse-Conducting Insulated Gate Bipolar Transistor: A Review of Current Technologies," in IEEE Transactions on Electron Devices, vol. 66, No. 1, pp. 219-231, Jan. 2019, doi: 10.1109/TED.2018.2882687.

M. Alam, N. Opondo, D. T. Morisette, and J. A. Cooper, "Demonstration of a 10-kV Class Waffle-Substrate n-Channel IGBT in 4H—SiC," IEEE Transactions on Electron Devices, vol. 69, No. 10, pp. 5683-5688, Oct. 2022.

J. Wei, M. Zhang, H. Jiang, B. Li, Z. Zheng, and K. J. Chen, "Investigation of p-Shielded SiC Trench IGBT with Considerations of IE Effect, Oxide Protection and Dynamic Degradation," International Symposium on Power Systems and Devices, Shanghai, China, May 19-23, 2019.

M. Sampath, A. Salemi, D. Morisette, and J. Cooper, "The IMOSFET: A Deeply-Scaled, Fully-Self-Aligned Trench MOSFET," Materials Science Forum, vol. 1004, pp. 751-757, 2020.

N. Opondo, J. A. Cooper, H. Liao, W. W. Chen, and D. T. Morisette, "The Waffle Substrate: A Novel Approach to Reducing Substrate Resistance in SiC Power Devices," Materials Science Forum, vol. 1004, pp. 738-746, 2020.

T. Kimoto and J. A. Cooper, Fundamentals of Silicon Carbide Technology, Wiley-IEEE, Singapore, 2017.

* cited by examiner

INSULATING-GATE BIPOLAR TRANSISTORS INCLUDING A REVERSE CONDUCTING DIODE

BACKGROUND

The present disclosure relates to semiconductor devices and integrated circuit manufacture and, more specifically, to structures for an insulated-gate bipolar transistor and methods of forming a structure for an insulated-gate bipolar transistor.

Wide bandgap semiconductors, such as silicon carbide, may be used in high-power applications and/or high-temperature applications. Silicon carbide is well suited for power switching because of advantageous properties, such as a high saturated drift velocity, a high critical field strength, an exceptional thermal conductivity, and a significant mechanical strength. An insulated-gate bipolar transistor is a three-terminal power semiconductor device developed to combine high efficiency with fast switching. An insulated-gate bipolar transistor may leverage the favorable properties of a silicon carbide substrate to enable, for example, power converters, motor inverters, and motor drivers that are characterized by high reliability and high efficiency when operating at a high voltage.

Improved structures for an insulated-gate bipolar transistor and methods of forming a structure for an insulated-gate bipolar transistor are needed.

SUMMARY

In an embodiment of the invention, a structure for a transistor is provided. The structure comprises a semiconductor substrate having a front surface and a back surface opposite from the front surface. The semiconductor substrate comprises a wide bandgap semiconductor material. The structure further comprises a gate electrode at the front surface of the semiconductor substrate, and a diode at the back surface of the semiconductor substrate.

In an embodiment of the invention, a method of forming a structure for a transistor is provided. The method comprises forming a gate electrode at a front surface of a semiconductor substrate. The semiconductor substrate comprises a wide bandgap semiconductor material, and the semiconductor substrate has a back surface opposite from the front surface. The method further comprises forming a diode at the back surface of the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
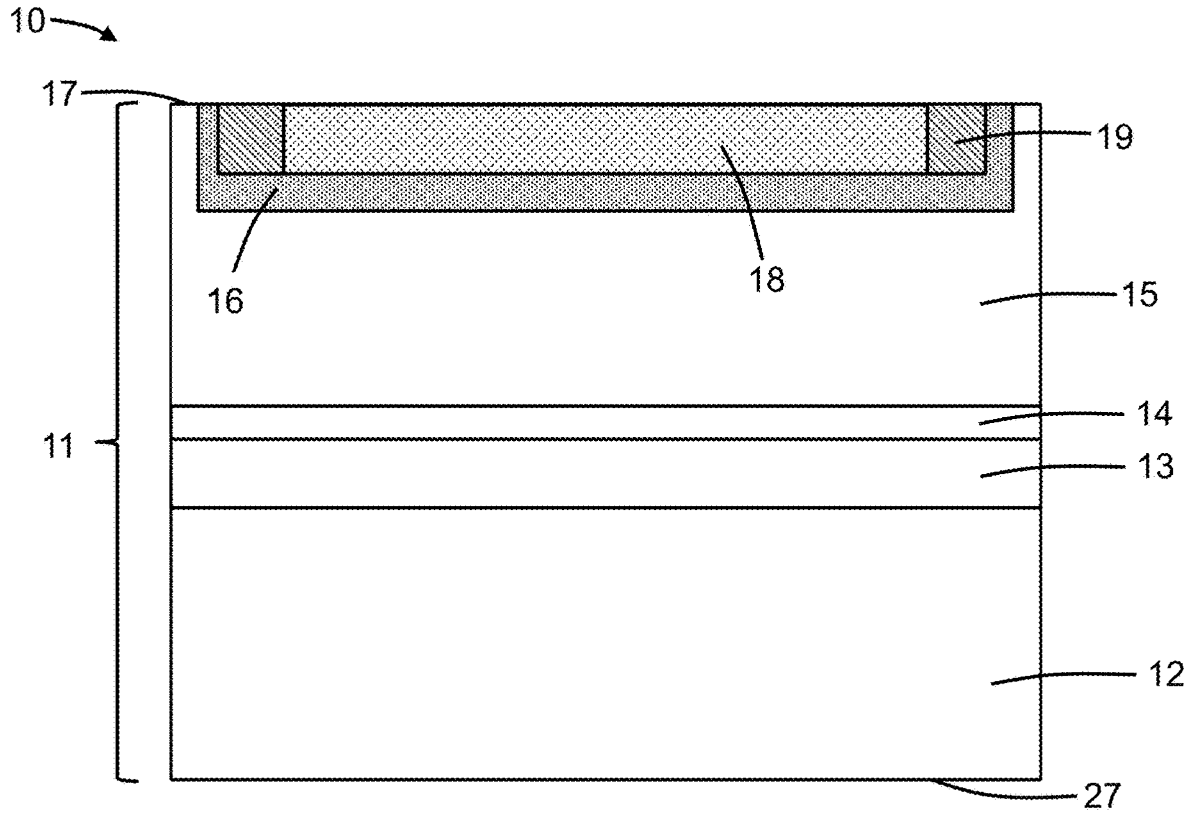
FIG. 1 is a cross-sectional view of a structure at an initial fabrication stage of a processing method in accordance with embodiments of the invention.

With reference to FIG. 1 and in accordance with embodiments of the invention, a structure 10 for an insulating gate bipolar transistor may be formed using a semiconductor substrate 11 that includes a bulk substrate 12 and a stack of semiconductor layers 13, 14, 15 formed by, for example, epitaxial growth on the bulk substrate 12. In an embodiment, the bulk substrate 12 and the semiconductor layers 13, 14, 15 of the semiconductor substrate 11 may be comprised of a wide bandgap semiconductor material. In an embodiment, the bulk substrate 12 and the semiconductor layers 13, 14, 15 of the semiconductor substrate 11 may be comprised of a wide bandgap semiconductor material. In an embodiment, the bulk substrate 12 and the semiconductor layers 13, 14, 15 may be comprised of silicon carbide, which is a wide bandgap semiconductor material. In an embodiment, the bulk substrate 12 and the semiconductor layers 13, 14, 15 may be comprised of diamond, which is a wide bandgap semiconductor material. In an embodiment, the bulk substrate 12 and the semiconductor layers 13, 14, 15 may be comprised of a semiconductor material having a melting point greater than the melting point of silicon.

In an embodiment, the bulk substrate 12 may be lightly doped to have either n-type or p-type electrical conductivity. For example, the dopant concentration in the bulk substrate 12 may be about $1\times10^{15}$ atoms per cubic centimeter to about $1\times10^{17}$ atoms per cubic centimeter to provide the light doping. The light doping of the bulk substrate 12 may operate to minimize the defectivity (i.e., defect density) of the bulk substrate 12. In an alternative embodiment, the bulk substrate 12 may be heavily doped to have n-type electrical conductivity. For example, the dopant concentration in the bulk substrate 12 may be about $1\times10^{18}$ atoms per cubic centimeter to about $1\times10^{20}$ atoms per cubic centimeter to provide the heavy doping.

In an embodiment, the semiconductor layer 13 may be doped to have p-type electrical conductivity. In an embodiment, the semiconductor layer 14 may be doped to have n-type electrical conductivity. In an alternative embodiment, the semiconductor layer 14 may be omitted from the semiconductor substrate 11. In an embodiment, the semiconductor layer 15 may be doped to have n-type electrical conductivity at a lower dopant concentration than the semiconductor layer 14. In an embodiment, the semiconductor layer 15 may define a drift region of a field-effect transistor that is integrated into the insulating gate bipolar transistor, the semiconductor layer 14 may define a field stop region, and the semiconductor layer 13 may define a drain of the field-effect transistor that is integrated into the insulating gate bipolar transistor and a terminal (e.g., an emitter) of the insulating gate bipolar transistor.

The semiconductor substrate 11 has a front surface 17 and a back surface 27 that is opposite to the front surface 17. The semiconductor layer 15 adjoins the front surface 17, and the bulk substrate 12 adjoins the back surface 27 such that the entire thickness of the semiconductor substrate 11 is arranged between the front surface 17 and back surface 27. In an embodiment, both surfaces 17, 27 may be planar immediately after the semiconductor layers 13, 14, 15 are formed. The semiconductor layer 13 is disposed between the semiconductor layer 14 and the back surface 27. The semiconductor layers 14, 15 are disposed between the semiconductor layer 13 and the front surface 17. The semiconductor layer 15 is disposed between the semiconductor layer 14 and the front surface 17. The bulk substrate 12 is disposed between the semiconductor layer 13 and the back surface 27.

A doped region 16 may be formed in the semiconductor layer 15 adjacent to the front surface 17 of the semiconductor substrate 11. The doped region 16 is doped to have an opposite conductivity type from the semiconductor layer 15. The doped region 16 has a lower boundary that defines an interface with the underlying semiconductor material of the semiconductor layer 15 across which the dopant type changes. In an embodiment, the doped region 16 may define a body of the field-effect transistor that is integrated into the insulating gate bipolar transistor.

The doped region 16 may be formed by introducing a dopant of a given conductivity type by, for example, ion implantation into the semiconductor layer 15. An implantation mask may be formed to define a selected area on the front surface 17 of the semiconductor substrate 11 that is exposed for the implantation of ions. The implantation mask may include a hardmask that is applied and patterned to form an opening exposing the selected area on the front surface 17 and determining, at least in part, the location and horizontal dimensions of the doped region 16. The implantation conditions (e.g., ion species, dose, kinetic energy, substrate temperature) may be selected to tune the electrical and physical characteristics of the doped region 16, to minimize defects, and to maximize the ionization and activation of the implanted dopants. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped region 16 may be doped with a concentration of a p-type dopant (e.g., aluminum) to provide p-type electrical conductivity.

A doped region 19 may be formed in the doped region 16. The doped region 19 may provide a body contact to the transistor body defined by the doped region 16. The doped region 19 may be formed by introducing a dopant of a given conductivity type by, for example, ion implantation into the semiconductor layer 15. An implantation mask may be formed to define a selected area on the front surface 17 of the semiconductor substrate 11 that is exposed for the implantation of ions. The implantation mask may include a hardmask that is applied and patterned to form an opening exposing the selected area on the front surface 17 and determining, at least in part, the location and horizontal dimensions of the doped region 19. The implantation conditions (e.g., ion species, dose, kinetic energy, substrate temperature) may be selected to tune the electrical and physical characteristics of the doped region 19, to minimize defects, and to maximize the ionization and activation of the implanted dopants. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped region 19 may be doped with a concentration of a p-type dopant (e.g., aluminum) to provide p-type electrical conductivity, and the dopant concentration of the doped region 19 may be greater than the dopant concentration of the doped region 16. In an alternative embodiment, additional regions like the doped region 19 may be disposed within the doped region 16.

A doped region 18 may be formed in the semiconductor layer 15 adjacent to the front surface 17 of the semiconductor substrate 11. The doped region 18 has the same conductivity type as the semiconductor layer 15 but at a higher dopant concentration. The doped region 18 has an upper boundary that may be coplanar or substantially coplanar with the front surface 17 of the semiconductor substrate 11 and a lower boundary that defines an interface with the doped region 16 across which the conductivity type changes. In an embodiment, the doped region 18 may define a source of the field-effect transistor that is integrated into the insulating gate bipolar transistor and a terminal (e.g., a collector) of the insulating gate bipolar transistor.

The doped region 18 may be formed by introducing a dopant of a given conductivity type by, for example, ion implantation into the semiconductor layer 15. An implantation mask may be formed to define a selected area on the front surface 17 of the semiconductor substrate 11 that is exposed for the implantation of ions. The implantation mask may include a hardmask that is applied and patterned to form an opening exposing the selected area on the front surface 17 of the semiconductor substrate 11 and determining, at least in part, the location and horizontal dimensions of the doped region 18. The implantation conditions (e.g., ion species, dose, kinetic energy, substrate temperature) may be selected to tune the electrical and physical characteristics of the doped region 18. In an embodiment, the ion implantation may be performed at substrate temperature in a range of 200° C. to 600° C. to minimize defect formation. The implantation mask, which is compatible with the implantation conditions and is stripped following implantation, has a thickness and stopping power sufficient to block the implantation of ions in masked areas. In an embodiment, the doped region 18 may be doped (e.g., heavily doped) with a concentration of an n-type dopant (e.g., nitrogen and/or phosphorus) to provide n-type electrical conductivity. In an embodiment, the doped region 18 may be doped with a higher concentration of the n-type dopant than the semiconductor layer 15.

Figure 2:
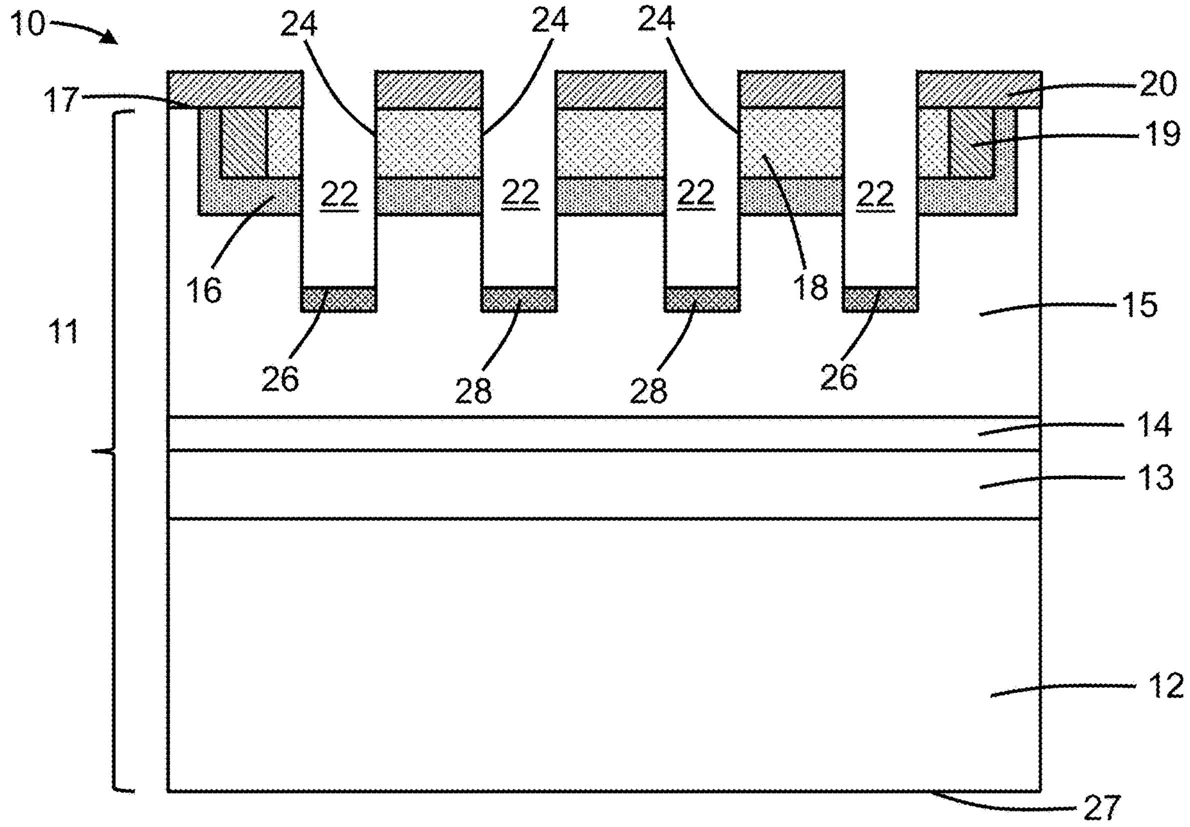
FIG. 2 is a cross-sectional view of the structure at a fabrication stage of the processing method subsequent to FIG. 1.

With reference to FIG. 2 in which like reference numerals refer to like features in FIG. 1 and at a subsequent fabrication stage, a dielectric layer 20 is applied on the front surface 17 of the semiconductor substrate 11 over the doped regions 16, 18, 19. The dielectric layer 20 may be comprised of silicon dioxide, which is patterned to define a hardmask. Trenches 22 are formed by an etching process that extend from the front surface 17 of the semiconductor substrate 11 through the doped regions 16, 18, 19 and into the semiconductor layer 15 beneath the doped region 16. Each trench 22 has a trench bottom 26 and sidewalls 24 that extend from the trench bottom 26 to the front surface 17.

A doped region 28 may be formed in the semiconductor layer 15 beneath and adjacent to the trench bottom 26 of each trench 22. The doped regions 28 have an opposite conductivity type from the semiconductor layer 15 and the doped region 16. The doped regions 28, which are formed after forming the trenches 22 and are self-aligned to the trenches 22, may define p-shields of the field-effect transistor that is integrated into the insulating gate bipolar transistor and may be connected to the doped region 16. The doped regions 28 may be connected to the doped regions 16, 19 and the doped region 18 by a doped region (not shown) that is disposed adjacent to the doped region 19 and that may have the same conductivity type as the doped regions 16, 19.

The doped regions 28 may be formed by introducing a dopant of a given conductivity type by, for example, ion implantation into the semiconductor layer 15. The trenches 22 in the dielectric layer 20 may determine, at least in part, the location and horizontal dimensions of the doped regions 28. The dielectric layer 20 has a thickness and stopping power sufficient to block the implantation of ions in masked areas. The implantation conditions (e.g., ion species, dose, kinetic energy, substrate temperature, tilt angle) may be selected to tune the electrical and physical characteristics of the doped regions 28. In an embodiment, the ion implantation may be performed at substrate temperature in a range of 200° C. to 600° C. to minimize defect formation. In an embodiment, the doped regions 28 may be doped with a concentration of a p-type dopant (e.g., aluminum) to provide p-type electrical conductivity.

A high-temperature anneal may be performed following the implantations to activate the implanted dopants and to alleviate post-implantation crystal damage. The high-temperature anneal may be performed with a removable carbon capping layer applied as a temporary coating and at a high temperature, such as a temperature in a range of 1600° C. to 1900° C., that is needed to activate the implanted dopants in a wide bandgap semiconductor material. The dielectric layer 20, which cannot withstand the high anneal temperature, is removed from the front surface 17 before the anneal is performed and before the carbon capping layer is applied. The removable carbon capping layer may prevent silicon outgassing during the high-temperature anneal. The carbon capping layer, which may be comprised of a cured and/or baked photoresist or a deposited layer of carbon, is removed following the high-temperature anneal.

Figure 3:
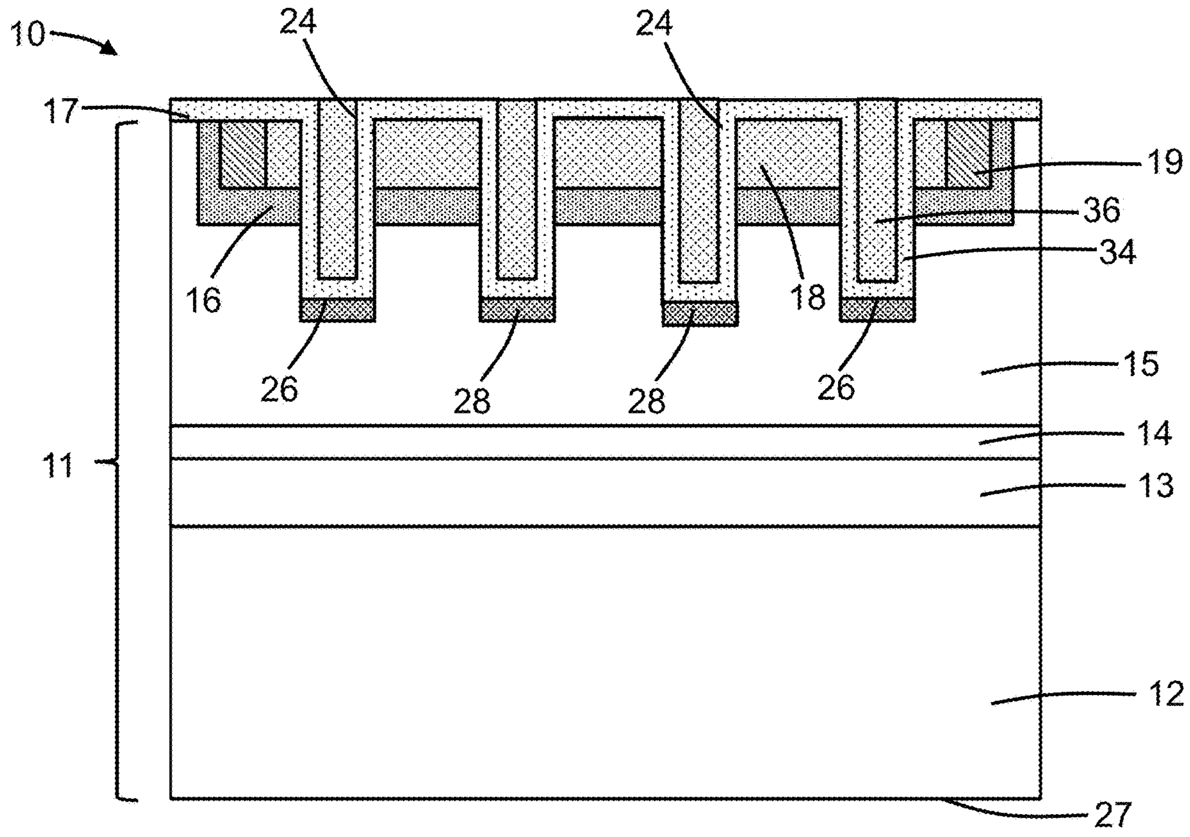
FIG. 3 is a cross-sectional view of the structure at a fabrication stage of the processing method subsequent to FIG. 2.

With reference to FIG. 3 in which like reference numerals refer to like features in FIG. 2 and at a subsequent fabrication stage, a gate dielectric layer 34 is formed on the sidewalls 24 and trench bottom 26 of each trench 22 and on the front surface 17 of the semiconductor substrate 11 adjacent to the trenches 22. In an embodiment, the gate dielectric layer 34 may be conformally deposited with a uniform or substantially uniform thickness. The surfaces of the semiconductor layer 15 bordering the sidewalls 24 and trench bottoms 26 of the trenches 22, as well as the front surface 17, may be cleaned before depositing the gate dielectric layer 34. A gate conductor layer 36 is deposited after depositing the gate dielectric layer 34, and the gate dielectric layer 34 and gate conductor layer 36 may be patterned by lithography and etching processes. In an embodiment, the gate conductor layer 36 may be comprised of a conductor, such as polysilicon or amorphous silicon that is heavily doped with an n-type dopant (e.g., phosphorus or arsenic), and the gate dielectric layer 34 may be comprised of a dielectric material, such as silicon dioxide. The portion of the gate conductor layer 36 inside each trench 22 defines a gate electrode. Portions of the gate dielectric layer 34 are disposed between the gate electrode and the sidewalls 24 of each trench 22, as well as between the gate electrode and the trench bottom 26 of each trench 22.

Figure 4:
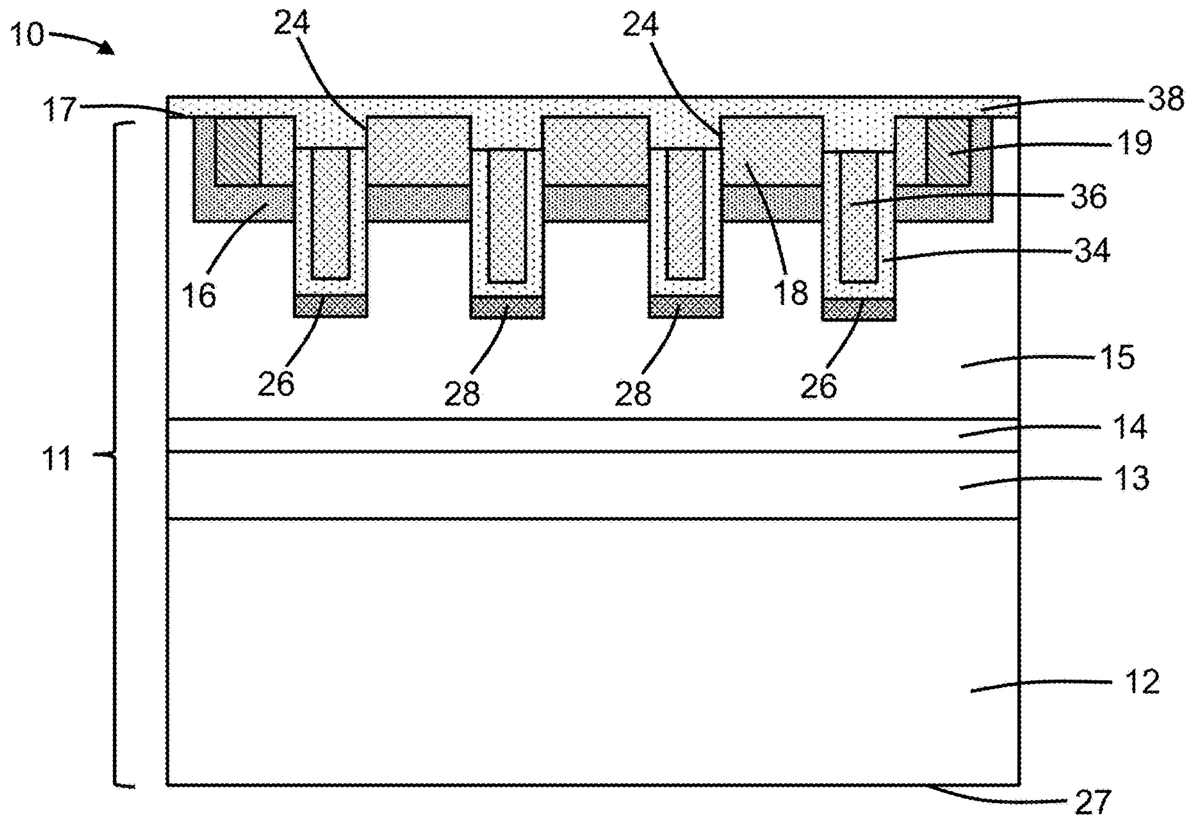
FIG. 4 is a cross-sectional view of the structure at a fabrication stage of the processing method subsequent to FIG. 3.

With reference to FIG. 4 in which like reference numerals refer to like features in FIG. 3 and at a subsequent fabrication stage, the gate conductor layer 36 is recessed inside each trench 22 by an etching process. A dielectric layer 38 is formed that includes a portion on the recessed gate conductor layer 36 inside each trench 22. The dielectric layer 38 may be comprised of a dielectric material, such as silicon dioxide, that is an electrical insulator. In an embodiment, the dielectric layer 38 may be formed by oxidizing the material of the gate conductor layer 36 and the material of the semiconductor layer 15 beneath the gate dielectric layer 34 on the front surface 17 with a thermal oxidation process. The gate dielectric layer 34 on the front surface 17 may be subsumed into the dielectric layer 38 and no longer distinguishable.

The portion of the gate conductor layer 32 and the gate dielectric layer 34 inside the trenches 22 define a gate of the insulated gate bipolar transistor. The gate is disposed at the front surface 17 of the semiconductor substrate 11. The gate dielectric layer 34 electrically insulates the portions of the gate conductor layer 32 from the surfaces of the semiconductor layer 15.

Figure 5:
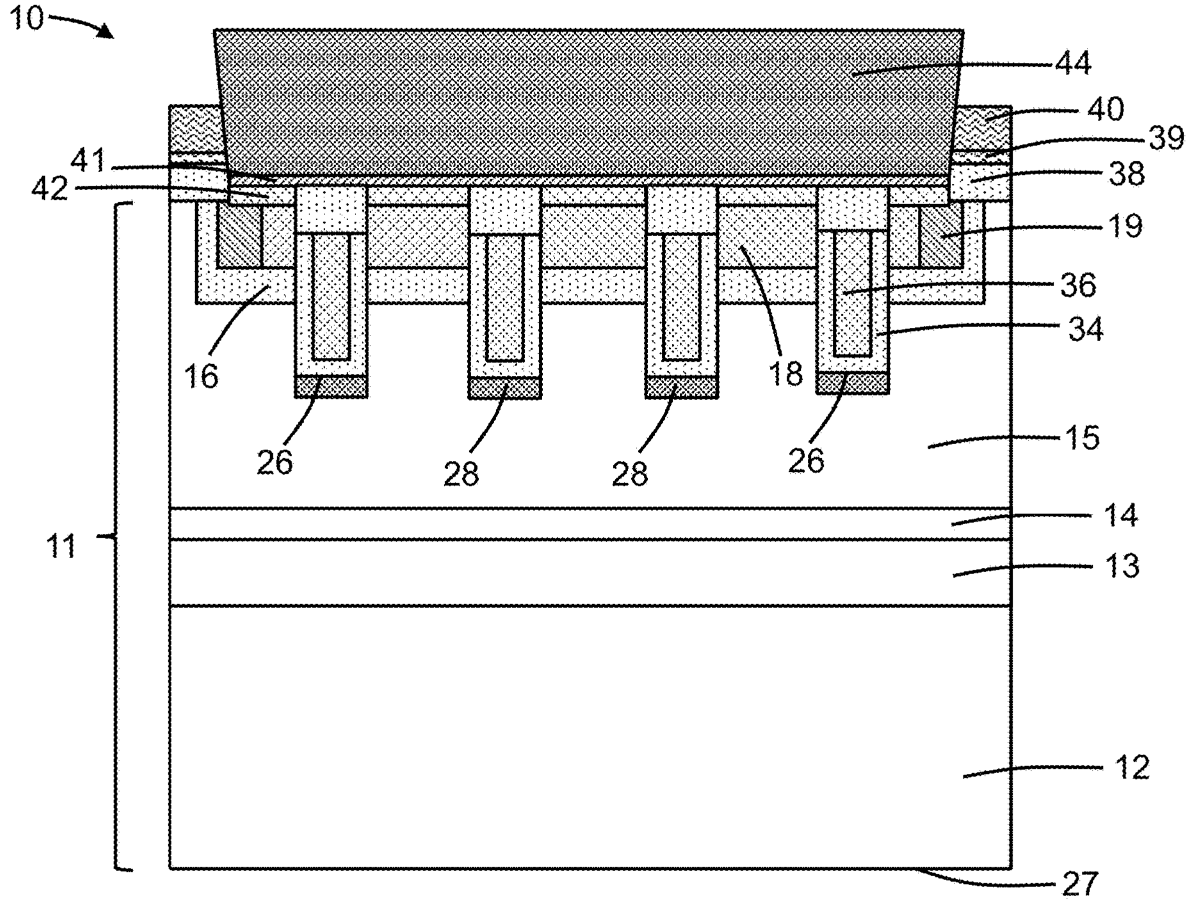
FIG. 5 is a cross-sectional view of the structure at a fabrication stage of the processing method subsequent to FIG. 4.

With reference to FIG. 5 in which like reference numerals refer to like features in FIG. 4 and at a subsequent fabrication stage, dielectric layers 39, 40 may be deposited on the front surface 17. Portions of the dielectric layers 39, 40 may fill divots in the dielectric layer 38 arising from the recessing of the gate conductor layer 36. The dielectric layer 39 may function as an etch stop layer that is comprised of, for example, silicon nitride, and the dielectric layer 40 may be an interlayer dielectric layer comprised of, for example, silicon dioxide. The dielectric layers 39, 40 are patterned with lithography and etching processes to define an opening extending to the front surface 17.

Silicide layers 42 are formed by a silicidation process on exposed areas of the front surface 17. The silicide layers 42 may be comprised of a metal, such as nickel. An electrode 44 comprised of, for example, aluminum may be formed that is coupled by the silicide layers 42 to the doped region 19 and doped region 18. A barrier layer 41, such as a bilayer of titanium and titanium nitride, may be disposed between the electrode 44 and the silicide layers 42. The dielectric layer 38 inside each trench 22 electrically isolates the electrode 44 from the gate electrodes defined by the portions of the gate conductor layer 36 inside the trenches 22.

Figure 6:
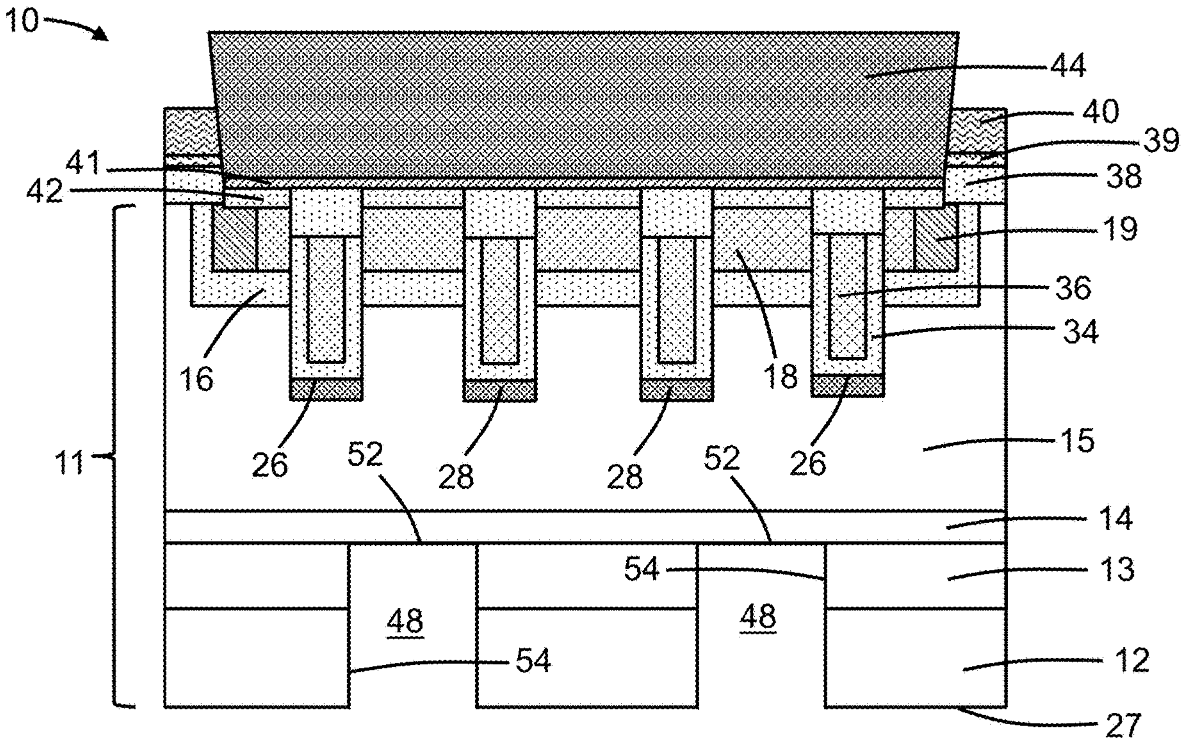
FIG. 6 is a cross-sectional view of the structure at a fabrication stage of the processing method subsequent to FIG. 5.

With reference to FIG. 6 in which like reference numerals refer to like features in FIG. 5 and at a subsequent fabrication stage, the bulk substrate 12 may be thinned from the back surface 27 of the semiconductor substrate 11, after the insulated gate bipolar transistor is formed, to reduce its thickness. Trenches 48 may be patterned by lithography and etching processes that penetrate from the back surface 27 through the thinned bulk substrate 12 and the semiconductor layer 13. In an embodiment, the trenches 48 may penetrate fully through the semiconductor layer 13 to the semiconductor layer 14. In an embodiment, the trenches 48 may have respective trench bottoms 52 that are coextensive with the semiconductor layer 14. In an alternative embodiment, the trenches 48 may penetrate to a shallow depth into the semiconductor layer 14. In an alternative embodiment, the trenches 48 may have respective trench bottoms 52 that are coextensive with the semiconductor layer 15 if the semiconductor layer 14 is absent. Each trench 48 has sidewalls 54 that extend from the back surface 27 to the trench bottom 52.

The trenches 48 divide the bulk substrate 12 and the semiconductor layer 13 into stacked sections. In particular, each trench 48 is disposed in a lateral direction between different sections of the semiconductor layer 13 and different sections of the bulk substrate 12 that are stacked with the sections of the semiconductor layer 13. The sections of the semiconductor layer 13 are disposed between the sections of the bulk substrate 12 and the semiconductor layer 14. Each section of the semiconductor layer 13 adjoins a portion of the semiconductor layer 14 to define a diode having a respective junction across which the conductivity type of the wide bandgap semiconductor material changes. The diodes may be reverse conducting diodes during device operation. The surface of a portion of the semiconductor layer 14 is disposed in a lateral direction at the trench bottom 52 between each adjacent pair of the trenches 48.

In an embodiment, the bulk substrate 12 and semiconductor layer 13 at the sidewalls 54 of the trenches 48 may be doped by, for example, a tilted ion implantation of a p-type dopant with rotation of the semiconductor substrate 11. In an embodiment, the semiconductor layer 14 at the trench bottoms 52 of the trenches 48 may be doped by, for example, a normal-incidence ion implantation of an n-type dopant. The resist layer used to pattern the trenches 48 may be used as an implantation mask. The semiconductor substrate 11 may be optionally annealed by a low-temperature furnace anneal or a laser anneal after the implantation(s).

Figure 7:
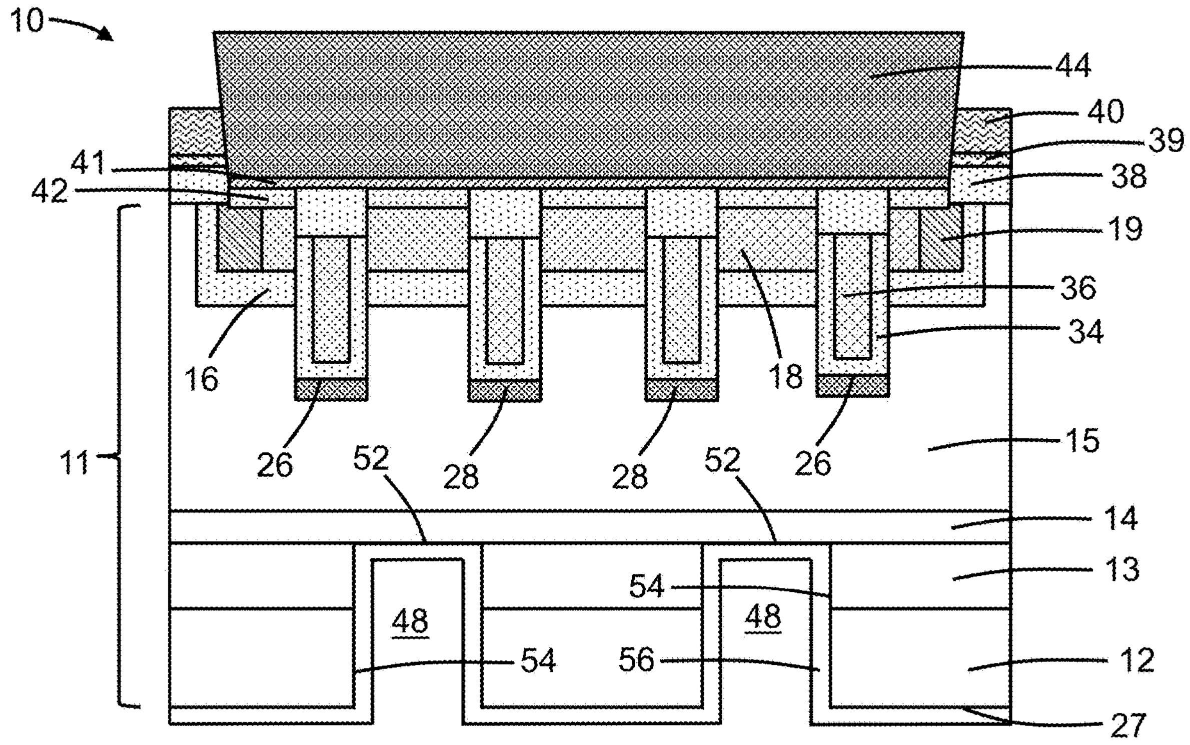
FIG. 7 is a cross-sectional view of the structure at a fabrication stage of the processing method subsequent to FIG. 6.

With reference to FIG. 7 in which like reference numerals refer to like features in FIG. 6 and at a subsequent fabrication stage, a layer 56 may be formed on the portions of the semiconductor layer 14 at the trench bottoms 52 and the stacked sections of the bulk substrate 12 and semiconductor layer 13 at the sidewalls 54 of the trenches 48, as well as on the bulk substrate 12 at the back surface 27 between the trenches 48. The layer 56 surrounds the diodes and connects the diodes to the semiconductor layer 15 defining the drift region that is disposed between the gate conductor layer 36 and the diodes.

In an embodiment, the layer 56 may be comprised of a conductor. In an embodiment, the layer 56 may be comprised of a metal silicide, such as nickel silicide. In an embodiment, the layer 56 may be comprised of a metal, such as nickel, that is conformally deposited and optionally heated using a laser in order to locally form a low-resistance nickel silicide contact to the exposed semiconductor material. In an embodiment, the layer 56 may include a layer stack comprised of multiple metal layers, such as a layer stack of titanium, nickel, and silver or a layer stack of titanium, nickel, and gold. In an embodiment, the layer 56 may include a metal silicide layer and a layer stack comprised of multiple metal layers, such as a layer stack of titanium, nickel, and gold. The layer 56 may also be comprised of a layer of a metal, such as aluminum. The layer 56 is disposed on each section of the semiconductor layer 13 and portions of the semiconductor layer 14 between the trenches 48 as a continuous coating. The layer 56 connects the sections of the semiconductor layer 13 of the different diodes in series.

The structure 10 includes reverse conducting diodes that are monolithically integrated with the insulated-gate bipolar transistor. The reverse conducting diodes are formed at the back surface 27 of the semiconductor substrate 11 after the insulated-gate bipolar transistor is formed at the front surface 17 of the semiconductor substrate 11. The formation of the reverse conducting diodes is compatible with processing requirements for wide bandgap semiconductor materials. In that regard, implantation and activation of dopants by a high-temperature anneal is not required to form the reverse conducting diodes at the back surface 27.

In an alternative embodiment, the insulated-gate bipolar transistor may have a planar-gate construction instead of the trench-gate construction. In that regard, the gate dielectric layer 34 and the gate conductor layer 36 may be formed on the front surface 17 of the semiconductor substrate 11 instead of inside the trenches 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an insulating gate bipolar transistor, the structure comprising:

a semiconductor substrate comprising silicon carbide, the semiconductor substrate having a front surface, a first semiconductor layer, a second semiconductor layer, a third semiconductor layer, and a back surface opposite from the front surface, the first semiconductor layer including a first section, a second section, and a first trench laterally between the first section and the second section, the first semiconductor layer having a first conductivity type, and the second semiconductor layer and the third semiconductor layer having a second conductivity type opposite from the first conductivity type; and a gate electrode at the front surface of the semiconductor substrate, wherein the first section of the first semiconductor layer adjoins a first portion of the second semiconductor layer, the second section of the first semiconductor layer adjoins a second portion of the second semiconductor layer, the first trench has a trench bottom that is coextensive with a third portion of the second semiconductor layer, the first section of the first semiconductor layer is arranged between the first portion of the second semiconductor layer and the back surface, the second section of the first semiconductor layer is arranged between the second portion of the second semiconductor layer and the back surface, the semiconductor substrate comprises a bulk substrate including a first section and a second section, the first section of the first semiconductor layer is arranged between the first section of the bulk substrate and the first portion of the second semiconductor layer, the second section of the first semiconductor layer is arranged between the second section of the bulk substrate and the second portion of the second semiconductor layer, and the bulk substrate is lightly doped.

2. The structure of claim 1 further comprising:

a conductor layer on the first section of the first semiconductor layer, the second section of the first semiconductor layer, and the third portion of the second semiconductor layer.

3. The structure of claim 1 wherein the first conductivity type is p-type, and the second conductivity type is n-type.

4. The structure of claim 1 wherein the third semiconductor layer contains a lower dopant concentration than the second semiconductor layer, and the third semiconductor layer is disposed between the second semiconductor layer and the front surface.

5. The structure of claim 1 wherein the semiconductor substrate includes a second trench extending from the front surface to a second trench bottom in the first semiconductor layer, the gate electrode is positioned inside the second trench, and further comprising:

a doped region in the third semiconductor layer beneath the second trench bottom, the doped region having the first conductivity type.

6. The structure of claim 5 wherein the second trench has a plurality of sidewalls, and further comprising:

a gate dielectric layer formed on the sidewalls and the second trench bottom of the second trench, wherein the gate dielectric layer is positioned between the gate electrode and the sidewalls of the second trench, and the gate dielectric layer is positioned between the gate electrode and the second trench bottom of the second trench.

7. The structure of claim 6 wherein the gate electrode comprises polysilicon having the second conductivity type or amorphous silicon having the second conductivity type, and the gate dielectric layer comprises silicon dioxide.

8. The structure of claim 1 wherein the first semiconductor layer comprises silicon carbide, the second semiconductor layer comprises silicon carbide, and the third semiconductor layer comprises silicon carbide.

9. A structure for an insulating gate bipolar transistor, the structure comprising:

a semiconductor substrate comprising silicon carbide, the semiconductor substrate having a front surface, a first semiconductor layer, a second semiconductor layer, a third semiconductor layer, and a back surface opposite from the front surface, the first semiconductor layer including a first section, a second section, and a first trench laterally between the first section and the second section, the first semiconductor layer having a first conductivity type, and the second semiconductor layer and the third semiconductor layer having a second conductivity type opposite from the first conductivity type; and a gate electrode at the front surface of the semiconductor substrate, wherein the first section of the first semiconductor layer adjoins a first portion of the second semiconductor layer, the second section of the first semiconductor layer adjoins a second portion of the second semiconductor layer, the first trench has a trench bottom that is coextensive with a third portion of the second semiconductor layer, the first section of the first semiconductor layer is arranged between the first portion of the second semiconductor layer and the back surface, the second section of the first semiconductor layer is arranged between the second portion of the second semiconductor layer and the back surface, the semiconductor substrate comprises a bulk substrate including a first section and a second section, the first section of the first semiconductor layer is arranged between the first section of the bulk substrate and the first portion of the second semiconductor layer, the second section of the first semiconductor layer is arranged between the second section of the bulk substrate and the second portion of the second semiconductor layer, the bulk substrate has the second conductivity type, and the bulk substrate is heavily doped.

10. A method of forming a structure for an insulating gate bipolar transistor, the method comprising:

forming a gate electrode at a front surface of a semiconductor substrate, wherein the semiconductor substrate comprises silicon carbide, the semiconductor substrate includes a bulk substrate, a first semiconductor layer, a second semiconductor layer, a third semiconductor layer, and a back surface opposite from the front surface, the first semiconductor layer including a first section, a second section, and a trench laterally between the first section and the second section, the first semiconductor layer having a first conductivity type, the second semiconductor layer and the third semiconductor layer having a second conductivity type opposite from the first conductivity type, the first section of the first semiconductor layer adjoins a first portion of the second semiconductor layer, the second section of the first semiconductor layer adjoins a second portion of the second semiconductor layer, the trench has a trench bottom that is coextensive with a third portion of the second semiconductor layer, the first section of the first semiconductor layer is arranged between the first portion of the second semiconductor layer and the back surface, the second section of the first semiconductor layer is arranged between the second portion of the second semiconductor layer and the back surface, the first semiconductor layer, the second semiconductor layer, and the third semiconductor layer are epitaxially grown on the bulk substrate, the bulk substrate comprises silicon carbide, the first semiconductor layer comprises silicon carbide, the second semiconductor layer comprises silicon carbide, and the third semiconductor layer comprises silicon carbide.

11. The method of claim 10 wherein the trench is formed after the gate electrode is formed.

12. The method of claim 10 further comprising:

forming a conductor layer on the first section of the first semiconductor layer, the second section of the first semiconductor layer, and the third portion of the second semiconductor layer.

13. The method of claim 10 wherein forming the gate electrode at the front surface of the semiconductor substrate comprises:

forming a second trench in the semiconductor substrate that extends from the front surface to a second trench bottom in the first semiconductor layer, wherein the gate electrode is positioned inside the second trench.

14. The method of claim 13 further comprising:

forming a doped region in the third semiconductor layer beneath the second trench bottom, wherein the doped region has the first conductivity type.

15. The method of claim 14 further comprising:

performing a high temperature anneal in a temperature in a range of 1600° C. to 1900° C. before forming the gate electrode.

16. The method of claim 15 further comprising:

forming a carbon capping layer before performing the high temperature anneal; and removing the carbon capping layer after performing the high temperature anneal.

17. The method of claim 10 further comprising:

forming a dielectric layer including a portion on the gate electrode.

18. The method of claim 17 wherein the gate electrode comprises polysilicon or amorphous silicon, and the portion of the dielectric layer is formed by oxidizing the polysilicon or the amorphous silicon of the gate electrode.

* * * * *